United States Patent [19]
Paganessi

[11] Patent Number: 5,660,047
[45] Date of Patent: Aug. 26, 1997

[54] REFRIGERATION SYSTEM AND METHOD FOR COOLING A SUSCEPTOR USING A REFRIGERATION SYSTEM

[75] Inventor: Joe Paganessi, Burr Ridge, Ill.

[73] Assignee: American Air Liquide, Inc., Houston, Tex.

[21] Appl. No.: 529,138

[22] Filed: Sep. 15, 1995

[51] Int. Cl.$^6$ .................................................. F25D 17/02
[52] U.S. Cl. .................... 62/64; 62/48.2; 62/52.1; 62/259.2
[58] Field of Search .................... 62/48.2, 52.1, 62/64, 259.2

[56] References Cited

U.S. PATENT DOCUMENTS

| | | | |
|---|---|---|---|
| 2,944,405 | 7/1960 | Basore et al. | 62/48.2 |
| 3,874,185 | 4/1975 | Etzbach | 62/48.2 |
| 4,110,996 | 9/1978 | Thompson | 62/48.2 |
| 4,116,017 | 9/1978 | Oberpriller | 62/51.1 |
| 4,164,127 | 8/1979 | Baumgartner | 62/51.1 |
| 4,237,700 | 12/1980 | Rothchild | 62/51.1 |

Primary Examiner—Ronald C. Capossel
Attorney, Agent, or Firm—Burns, Doane, Swecker & Mathis, L.L.P.

[57] ABSTRACT

The refrigeration system according to the invention includes a vacuum jacketed pressure vessel which contains both a spray heat exchanger and a shell and tube heat exchanger. The spray heat exchanger includes one or more nozzles for directing a first refrigerant at a heat exchanger element conveying a second refrigerant. The first refrigerant is sprayed in a fine mist from the nozzles onto the heat exchanger element conveying the second refrigerant. The first refrigerant then evaporates and cools the second refrigerant within the heat exchanger element. The shell and tube heat exchanger is a counter current heat exchanger which includes an inner tube for conveying the second refrigerant to the spray heat exchanger, and an outer tube surrounding the inner tube for conveying the first refrigerant recovered from the interior of the vacuum jacketed pressure vessel out of the pressure vessel. The spray heat exchanger recovers the heat of vaporization of the primary refrigerant, while the shell and tube heat exchanger recovers the enthalpy remaining in the evaporated first refrigerant.

27 Claims, 6 Drawing Sheets

REFRIGERATION SYSTEM AND METHOD FOR COOLING A SUSCEPTOR USING A REFRIGERATION SYSTEM

BACKGROUND OF THE INVENTION

1. Field of the Invention

The present invention relates to a refrigeration system and a method for cooling objects using the refrigeration system, and more particularly, the invention relates to a refrigeration system which operates with a primary refrigerant and a secondary refrigerant to provide a more efficient cooling system capable of cooling to cryogenic temperatures.

2. Description of the Related Art

The manufacture of semiconductor wafers involves various steps, such as plasma etching of the wafers, which require a wafer processing apparatus to be cooled. During wafer processing, the wafer is cooled by cooling a portion of the wafer processing apparatus called a susceptor which is positioned beneath the wafer. The susceptor is cooled by passing a cold fluid refrigerant through channels within the susceptor. The temperature to which the susceptor is cooled affects the rate of plasma etching or the etch rate of the wafer.

Manufacturers of semiconductors have expressed interest in being able to change the etch rate in a step-wise fashion, for example, to use a high etch rate to etch a wide area of the wafer and then change to a lower etch rate to reduce the width of the etch. To achieve this step-wise change in etch rate the temperature of the susceptor must be changed quickly. A series of step-wise temperature changes can be provided by controlling a cooling system with a control system having a preset temperature program. Cooling systems which are known for use in the semiconductor industry and which can achieve the cooling required for these step-wise changes in etch rate include very large mechanical cooling systems, typically using freon. However, these mechanical cooling systems suffer from the drawback that they tend to be too large for use in the electronics industry where space is at a premium. An additional disadvantage of freon cooling systems is their poor efficiency at low temperatures. The conventional freon cooling systems also do not accurately produce the desired temperatures at the susceptor, especially when a control system having a preset temperature program is used.

SUMMARY OF THE INVENTION

In accordance with the present invention a refrigeration system is presented which uses a first refrigerant and a second refrigerant to provide stable cooling power at temperatures down to cryogenic. The inventive refrigeration system provides a large increase in efficiency and a decrease in size over conventional mechanical refrigeration systems using freon.

One aspect of the invention relates to a refrigeration system comprising a vacuum jacketed pressure vessel containing both a spray heat exchanger, and a shell and tube heat exchanger. The spray heat exchanger, which recovers the heat of vaporization of a liquid, includes at least one nozzle for directing a first refrigerant, and a refrigerant conveying system for conveying a second refrigerant. The at least one nozzle directs the first refrigerant toward the refrigerant conveying system so that the first refrigerant contacts and cools the refrigerant conveying system, and thus cools the second refrigerant flowing within the conveying system. The shell and tube heat exchanger, which recovers the enthalpy available in the first refrigerant sprayed from the at least one nozzle of the spray heat exchanger, includes an inner tube for conveying the second refrigerant to the refrigerant conveying system of the spray heat exchanger, and an outer tube surrounding the inner tube for conveying the first refrigerant recovered from the spray heat exchanger.

In accordance with another aspect of the present invention, the refrigeration system comprises a vacuum jacketed pressure vessel, a primary liquid refrigerant delivery system which includes at least one spray nozzle mounted within the vacuum jacketed pressure vessel, and a secondary refrigerant circulation system which circulates a secondary refrigerant through the vacuum jacketed pressure vessel to an object to be cooled. The at least one spray nozzle is positioned to spray primary liquid refrigerant at a portion of the secondary refrigerant circulation system. The sprayed primary liquid refrigerant evaporates and cools the secondary refrigerant within the secondary refrigerant circulation system. A gas recovery system is provided within the vacuum jacketed pressure vessel for recovering the evaporated primary refrigerant which is used to precool the secondary refrigerant.

In accordance with another aspect of the present invention, a method of cooling an object involves the use of a refrigeration system comprising a combination of a spray heat exchanger and a counter current heat exchanger contained within a vacuum jacketed pressure vessel. The method includes the steps of providing a primary refrigerant and a secondary refrigerant in liquid form, cooling the secondary refrigerant with the spray heat exchanger by spraying the primary refrigerant onto a manifold containing the secondary refrigerant, wherein the evaporation of the primary refrigerant cools the secondary refrigerant, recovering the evaporated primary refrigerant in a counter current heat exchanger, precooling the secondary refrigerant with the evaporated primary refrigerant in the counter current heat exchanger, and circulating the secondary refrigerant to cool the object.

In accordance with a further aspect of the present invention, a method is presented for cooling a susceptor in a semiconductor wafer fabrication process. The method includes the steps of providing a primary refrigerant and a secondary refrigerant in liquid form, cooling the secondary refrigerant with a spray heat exchanger by spraying the primary refrigerant onto a manifold containing the secondary refrigerant, wherein the evaporation of the primary refrigerant cools the secondary refrigerant, recovering the evaporated primary refrigerant in a shell and tube heat exchanger, precooling the secondary refrigerant with the evaporated primary refrigerant in the shell and tube heat exchanger, and controlling the flow of at least one of the primary and the secondary refrigerants to cool the susceptor to a desired temperature.

BRIEF DESCRIPTION OF THE DRAWING FIGURES

The various aspects of the invention will be described in greater detail with reference to the accompanying drawing figures in which like elements bear like reference numerals, and wherein.

These drawing figures are merely illustrative and are not intended to be drawn to scale.

DETAILED DESCRIPTION

The refrigeration system according to the present invention employs a first refrigerant and a second refrigerant to provide refrigeration which is more efficient at lower temperatures than a conventional freon refrigeration system and a system which is much smaller than conventional systems. The refrigeration system includes a combination of a spray heat exchanger 20, and a shell and tube heat exchanger 30 mounted within a single vacuum jacketed pressure vessel 10.

Figure 1:
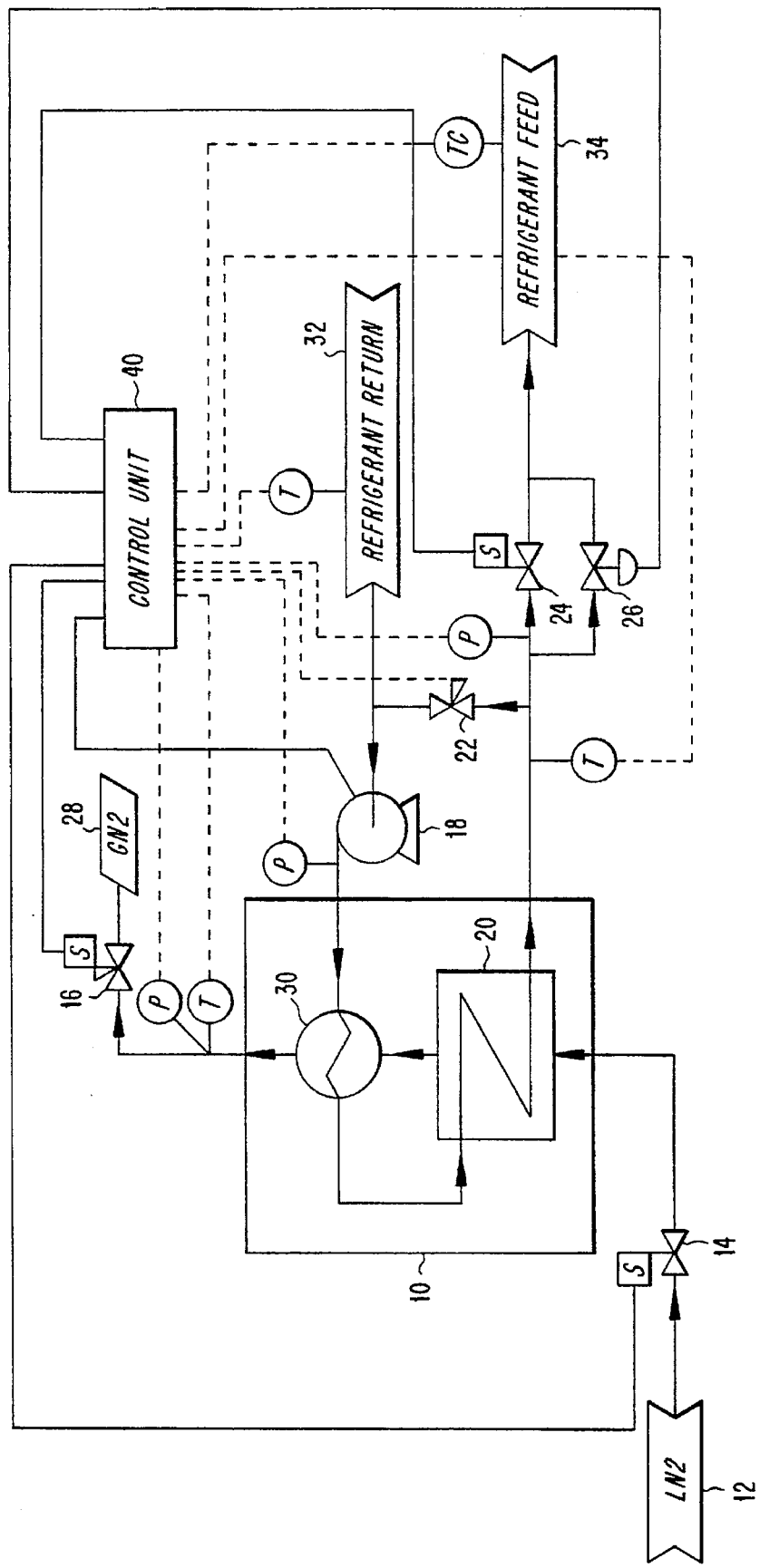
FIG. 1 is a fluid flow and control system diagram of the process according to the invention.

FIG. 1 illustrates a schematic diagram of the fluid flow and control systems of the present invention. The primary elements of the refrigeration system include vacuum jacketed pressure vessel 10, spray heat exchanger 20, shell and tube counter current heat exchanger 30 and a control unit 40. A primary refrigerant in liquid form, which is preferably liquid nitrogen, is delivered from a pressurized refrigerant source 12. The heat exchanger according to the present invention is described herein as employing a primary refrigerant of liquid nitrogen. However, it should be understood that other primary refrigerants may be used, depending on the desired application, without departing from the scope of the invention. For example, primary refrigerants such as nitrogen argon, krypton, neon, and mixtures thereof may be used. The primary refrigerant may also include some amount of impurities.

The liquid $N_2$ from refrigerant source 12, controlled by a solenoid valve 14, enters spray heat exchanger 20 where the $N_2$ is sprayed through one or more nozzles (not shown in FIG. 1). The $N_2$ is sprayed through the nozzles which cause the $N_2$ form a fine mist which impacts a secondary refrigerant conveying system. The $N_2$ then evaporates and the heat of vaporization of the $N_2$ is used to cool a secondary refrigerant in the conveying system. The structure and operation of spray heat exchanger 20 will be described in more detail below with reference to FIGS. 2–4.

The $N_2$ in gaseous form within vacuum jacketed pressure vessel 10, which has been evaporated by spraying through the nozzles of spray heat exchanger 20, is recovered and enters shell and tube heat exchanger 30. The gaseous $N_2$ entering shell and tube heat exchanger 30 is still cold after the evaporation in the spray heat exchanger. The enthalpy available in this cold $N_2$ gas can be recovered by precooling the secondary refrigerant flowing in an opposite direction through shell and tube heat exchanger 30. The structure and operation of shell and tube heat exchanger 30 will be explained further below. The $N_2$ gas exiting shell and tube heat exchanger 30 is controlled by a solenoid valve 16 and is exhausted at $N_2$ gas exhaust 28.

According to the present invention, a closed secondary refrigeration system is provided in which the secondary refrigerant is circulated to cool an object, such as a susceptor used in a semiconductor wafer fabrication process. The secondary refrigerant may be propane, ethanol, propylene, methane, ammonia, n-butane, iso-butane, mixtures thereof, or any other suitable refrigerant. In the closed secondary refrigeration system, the secondary refrigerant is returned from the object being cooled by a refrigerant return 32. The secondary refrigerant is circulated by a pump 18 to shell and tube heat exchanger 30 in which it is precooled by the $N_2$ gas. From shell and tube heat exchanger 30 the secondary refrigerant passes to spray heat exchanger 20 where the final cooling is performed. The secondary refrigerant is then delivered to a refrigerant feed 34 where it is used to cool an object such as a susceptor.

The flow of the secondary refrigerant through the closed system is preferably controlled by three control valves located at the exit of spray heat exchanger 20 which include a by-pass valve 22, a solenoid valve 24, and a small modulating valve 26. Small modulating valve 26 is used to provide moderate decreases in temperature and/or maintenance of temperature of the susceptor. Solenoid valve 24 is opened to provide greater decreases in temperature of the susceptor in a shorter time than is possible with modulating valve 26. Finally, by-pass valve 22 allows the secondary refrigerant to be recirculated through heat exchangers 20 and 30 to achieve relatively constant refrigerant flows, thus allowing for more constant refrigerant temperatures. The use of by-pass valve 22, in combination with either modulating valve 26 or solenoid valve 24, allows the system to achieve very low temperatures in a short duration of time.

The refrigeration system according to the present invention, using liquid $N_2$ as a primary refrigerant, can achieve secondary refrigerant temperatures in the range of −190° C. to 20° C. The system of the present invention has a large cooling capacity which provides the ability to achieve cryogenic temperatures while having a small foot print (in other words, the system does not require as much floor space as a conventional system).

The heat exchanger according to the present invention preferably includes a control system which incorporates a plurality of pressure sensors P and temperature sensors T, each of which is connected to a control unit 40. Control unit 40 controls valves 14, 16, 22, 24, 26 and pump 18 according to the information received from pressure sensors P and temperature sensors T and information input by the user. Control unit 40 may also be programmed to carry out a preset temperature program to achieve step-wise control of the temperature of an object.

Figure 3:
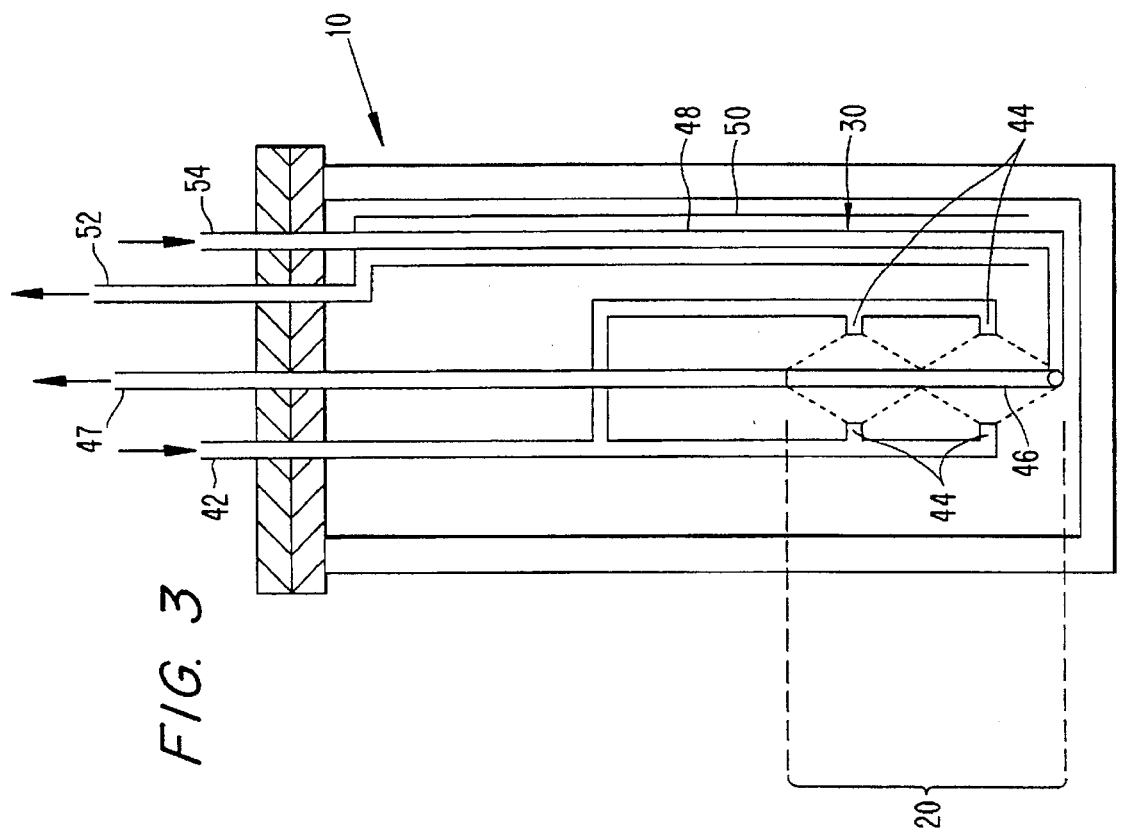
FIG. 3 is a schematic, cross sectional, side view of the refrigeration system of FIG. 2, taken at 90° to FIG. 2, with only one segment of the shell and tube heat exchanger illustrated.
Figure 2:
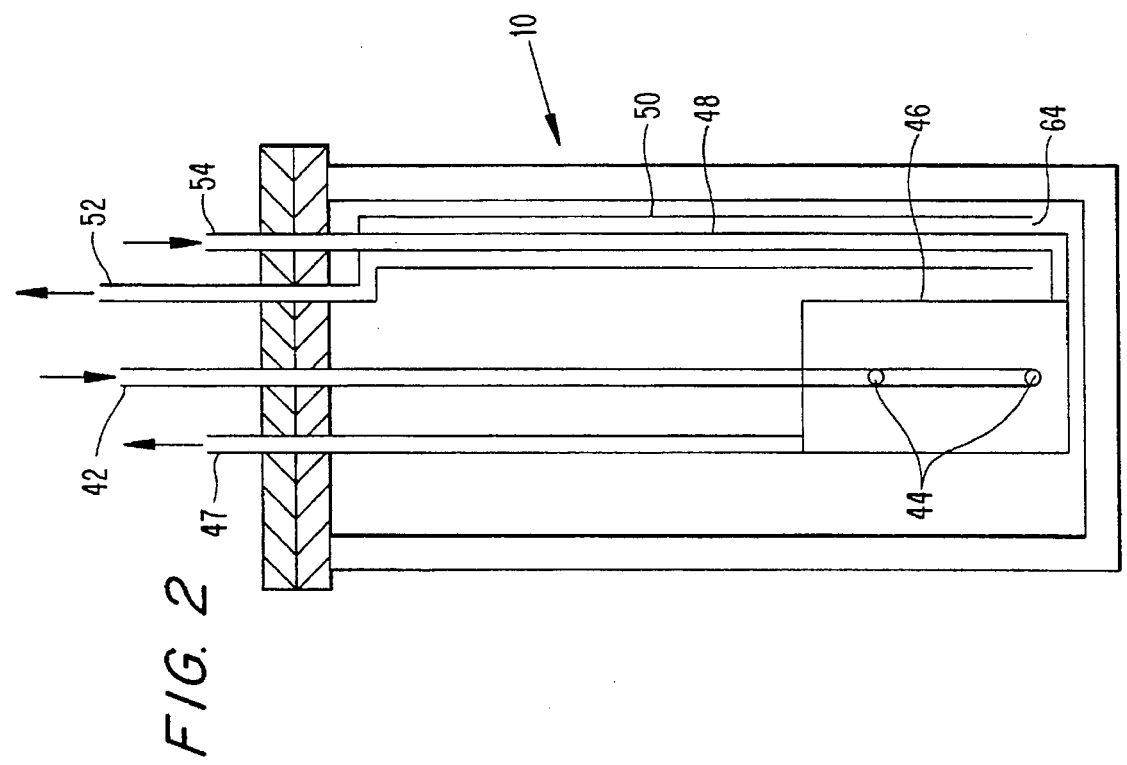
FIG. 2 is a schematic, cross sectional, side view of a refrigeration system according to the present invention with only one segment of the shell and tube heat exchanger illustrated.
Figure 4:
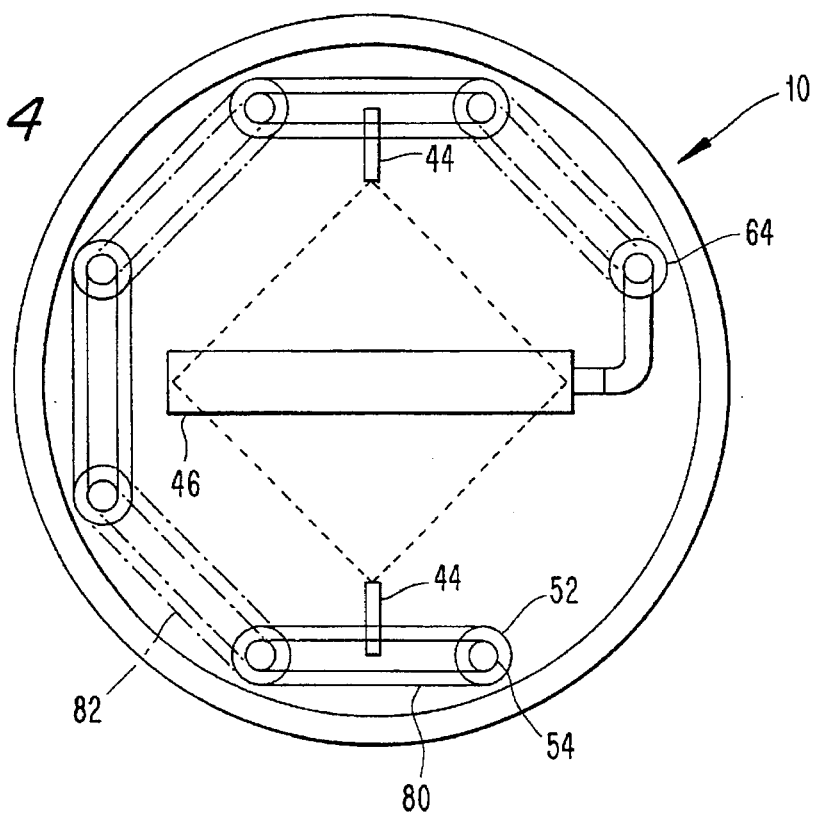
FIG. 4 is a schematic, cross sectional, top view of the refrigeration system according to FIGS. 2 and 3.

Schematic side views of the substantially cylindrical vacuum jacketed pressure vessel 10 are illustrated in FIGS. 2 and 3. Spray heat exchanger 20 is preferably positioned in a center portion of vacuum jacketed pressure vessel 10 while shell and tube heat exchanger 30 is preferably disposed in a serpentine manner around the interior perimeter of vacuum jacketed pressure vessel 10. For clarity, shell and tube heat exchanger 30 is illustrated in FIGS. 2 and 3 as having only a single vertical segment. However, as can be seen in FIG. 4, shell and tube heat exchanger 30 includes a plurality of vertical segments which are connected by curved end segments.

As illustrated in FIG. 2, the primary refrigerant, which is preferably pressurized liquid $N_2$, enters the vacuum jacketed pressure vessel through an inlet pipe 42. The liquid $N_2$ is sprayed from four nozzles 44 which are located on both sides of a heat exchanger element 46. The liquid $N_2$ which is sprayed in a fine mist onto heat exchanger element 46 evaporates, thereby, cooling heat exchanger element 46 which in turn cools the secondary refrigerant which is flowing through heat exchanger element 46. Nozzles 44 are preferably arranged to spray a fine mist of droplets over the entire or substantially entire surface of heat exchanger element 46. The number of nozzles 44 and the nozzle size may be varied to tailor the refrigeration output for a particular application. An increased number and size of the nozzles provides for more rapid cooling of the second refrigerant and an overall high cooling capacity for the system.

The cold $N_2$ gas within vacuum jacketed pressure vessel 10 is exhausted through shell and tube heat exchanger 30 where the enthalpy of the cold $N_2$ gas is recovered. Shell and tube heat exchanger 30 includes an inner tube 48 and an outer concentric tube 50 surrounding inner tube 48. The cold $N_2$ gas enters shell and tube heat exchanger 30 through an inlet 64 near the bottom of vacuum jacketed pressure vessel 10. The cold $N_2$ gas passing through outer concentric tube 50 cools the secondary refrigerant which is passing through inner tube 48 of shell and tube heat exchanger 30. The primary refrigerant is exhausted from shell and tube heat exchanger 30 through a $N_2$ exhaust 52. Exhaust 52 may be configured to exhaust $N_2$ gas at pressures of 30 psi to 100 psi. This exhausted $N_2$ gas may be used in other applications.

The secondary refrigerant enters vacuum jacketed pressure vessel 10 through a pipe 54 which is connected to inner tube 48 of shell and tube heat exchanger 30. The secondary refrigerant is precooled as it passes through inner tube 48 of shell and tube heat exchanger before it enters the bottom of heat exchanger element 46.

Figure 6:
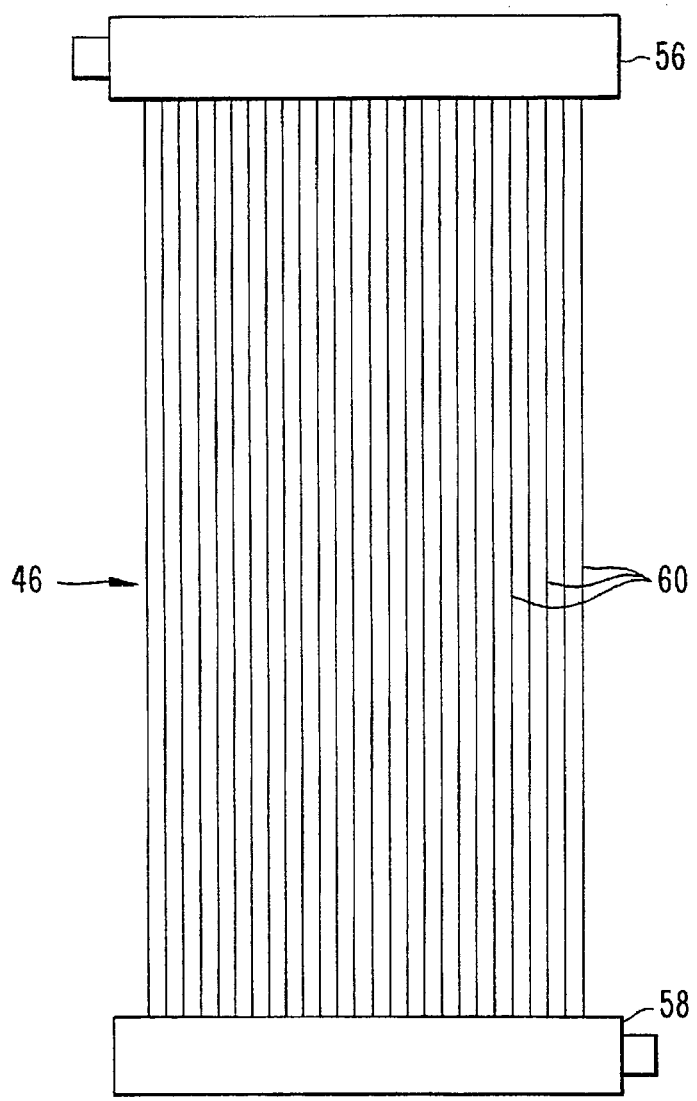
FIG. 6 is a side view of a spray heat exchanger element according to the present invention.
Figure 7:
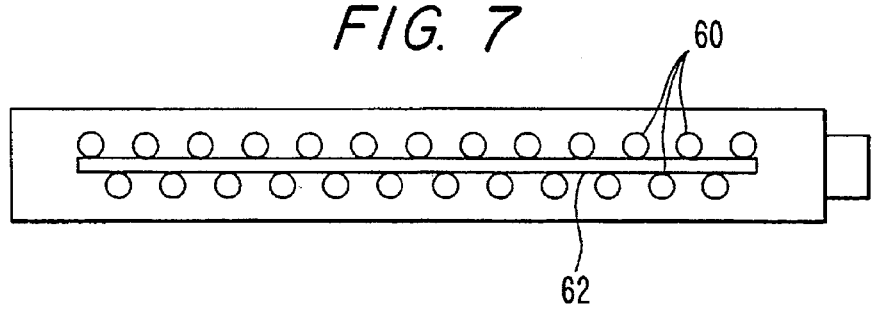
FIG. 7 is an enlarged, cross sectional, view of the spray heat exchanger element of FIG. 6.

Heat exchanger element 46, as illustrated in FIGS. 6 and 7, includes an upper manifold 56, a lower manifold 58, and a plurality of tubes 60 extending between the upper and lower manifolds. As illustrated in FIG. 7, tubes 60 are positioned in a staggered manner on both sides of a plate 62. Plate 62 serves to separate the streams of $N_2$ from nozzles 44 provided on either side of heat exchanger element 46. Plate 62 also increases the surface area of heat exchanger element 46, improving heat transfer. Heat exchanger element 46 and a cold refrigerant exit pipe 47 form a refrigerant conveying system.

As illustrated in FIG. 4, shell and tube heat exchanger 30 winds up and down around the periphery of the inside of vacuum jacketed pressure vessel 10. Shell and tube heat exchanger 30 includes a plurality of vertical segments which are connected to lower curved segments 80 and upper curved segments 82 which are depicted with broken lines in FIG. 4. This arrangement provides a heat exchanger which is extremely compact because a large number of segments can be disposed within vacuum jacketed pressure vessel 10. The length of shell and tube heat exchanger 30 may be varied by changing the number of vertical and curved segments. The appropriate length of shell and tube heat exchanger 30 will depend on the amount of enthalpy available to be recovered from the cold $N_2$ gas. Spray heat exchanger 20 is preferably arranged in the center of the vacuum jacketed pressure vessel 10 with nozzles 44 positioned perpendicular to and spaced from heat exchanger element 46. As shown in FIG. 4, nozzles 44 may be positioned between two of the vertical segments of shell and tube heat exchanger 30.

Figure 5:
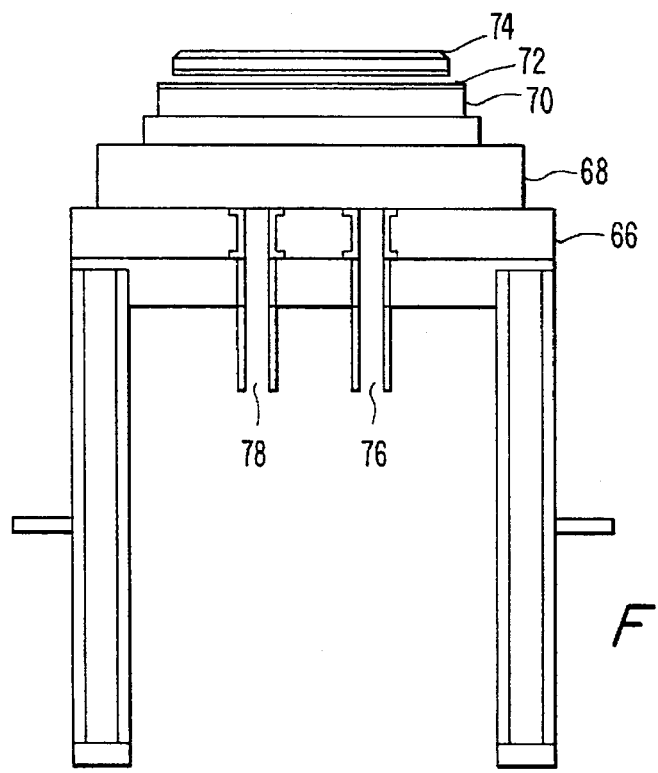
FIG. 5 is a side view of a semiconductor fabrication test stand.

FIG. 5 illustrates a test stand used to test the present invention. The test stand represents an example of an apparatus which is used for semiconductor fabrication. The test stand includes an insulator 66, a susceptor 68, and a wafer support 70. A dummy wafer 72 and a resistance heater 74 were positioned on the test stand for purposes of testing the present invention. Susceptor 68 is provided with cooling tubes including an inlet 76 and an outlet 78 through which the second refrigerant is circulated to cool susceptor 68.

Figure 9:
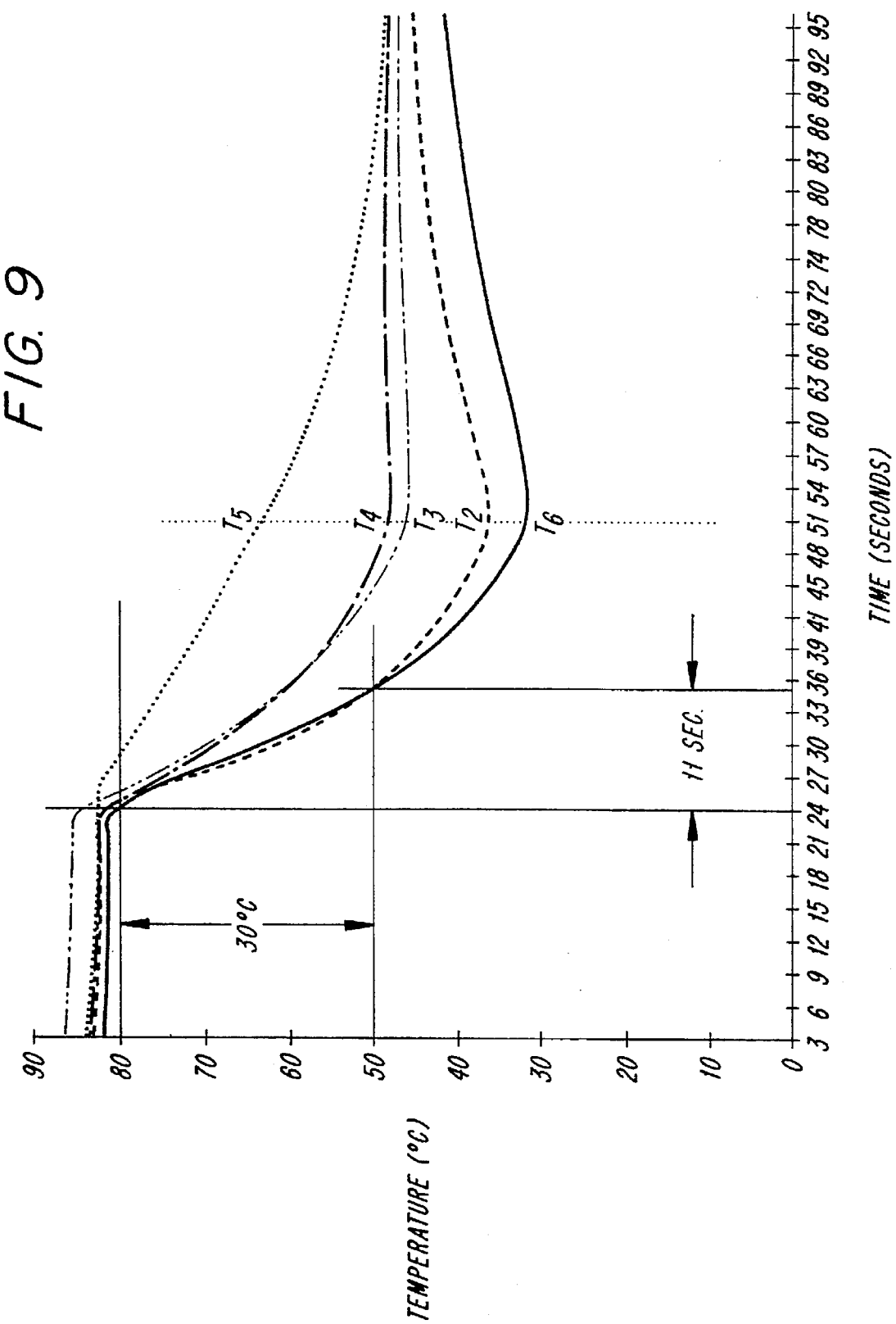
FIG. 9 is a graph of temperatures at various locations on a susceptor versus time.

The heat exchanger of the present invention was connected to the test stand illustrated in FIG. 5 to determine the temperatures which could be achieved on susceptor 68. FIG. 9 illustrates a graph of the temperature of various locations on susceptor 68 versus time. Susceptor 68 was first heated with resistance heater 74, having a heating capacity of 2 kW, and temperatures were maintained between 80° C. and 90° C. by operation of modulating valve 26 which allowed secondary refrigerant to circulate through susceptor 68. Susceptor 68 was then further cooled by opening solenoid valve 24 and allowing the secondary refrigerant to circulate at a higher rate through the susceptor. The curves $T_2$, $T_3$, $T_4$, and $T_5$ represent the temperature of various locations on the susceptor over time. As illustrated in FIG. 9, the temperature of susceptor 68 dropped 30° C. in about 11 seconds. Due to its high efficiency and quick response time, the refrigeration system of present invention can advantageously replace conventional refrigeration systems in most applications where either low temperatures, accurate temperatures, or quick response times are required. The system of the present invention is particularly advantageous for use in systems where the use of temperature programs with preset temperature changes is required.

Figure 8:
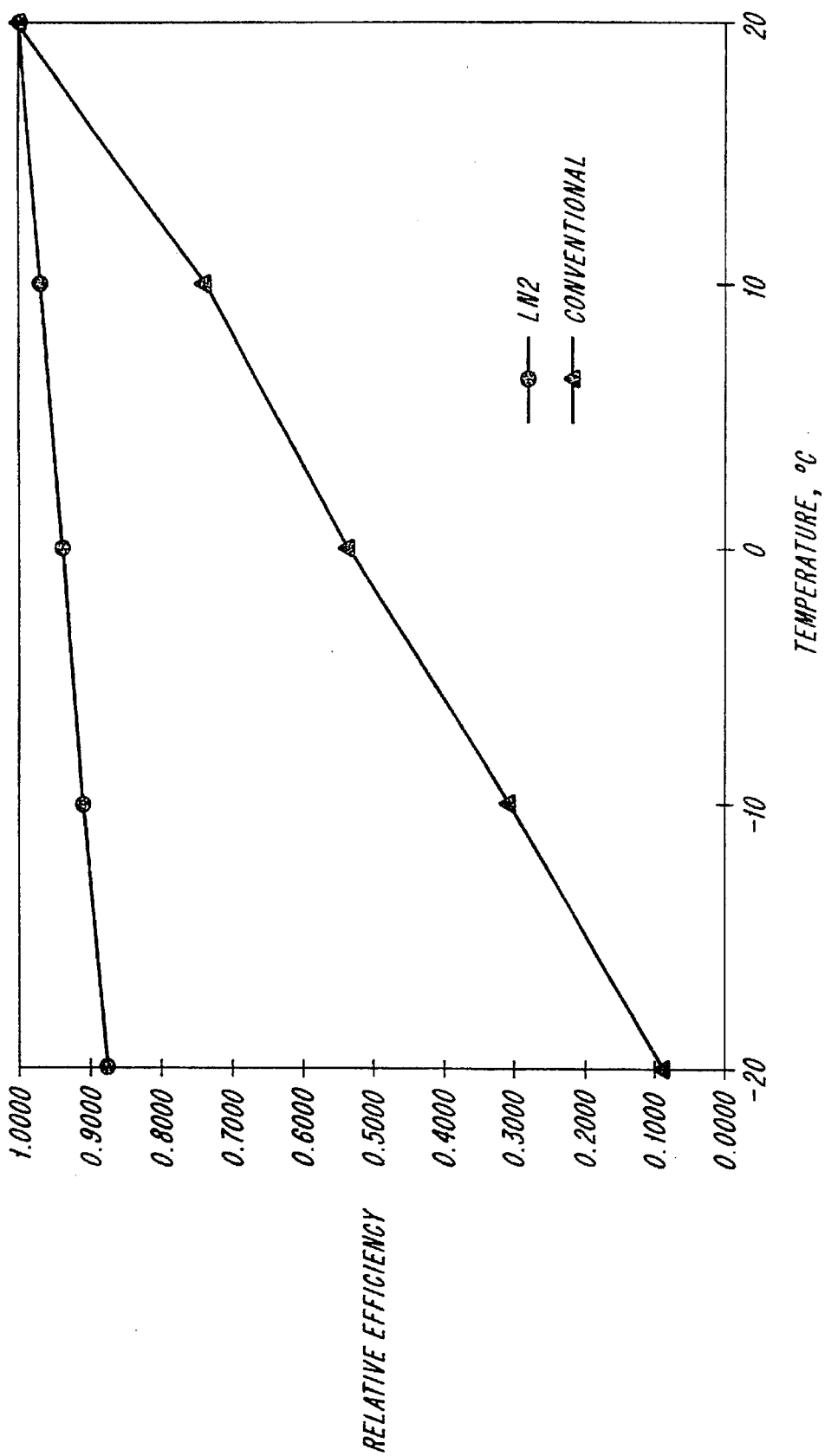
FIG. 8 is a graph comparing the relative efficiency of a liquid nitrogen refrigeration system of the invention with a conventional freon refrigeration system.

As illustrated in FIG. 8, the refrigeration system according to the present invention is much more thermodynamically efficient than a conventional refrigeration system using freon. In particular, when cooling from 20° C. to –20° C. is required, the conventional refrigeration system has a relative thermodynamic efficiency of between 8% and 9%. Whereas, the system of the present invention, when cooling from 20° C. to –20° C., has a relative thermodynamic efficiency of about 88%. For applications where cooling to temperatures of –40° C. and lower is required, the conventional mechanical systems have extremely poor thermodynamic efficiencies. In addition to the great increase in thermodynamic efficiency provided by the present invention, the present invention is up to approximately one tenth the size of the conventional refrigeration system which would be necessary to achieve the same amount of cooling.

While the invention has been described in detail with reference to a preferred embodiment thereof, it will be apparent to one skilled in the art that various changes can be made, and equivalents employed without departing from the spirit and scope of the invention.

What is claimed is:

1. A method of cooling a susceptor in a semiconductor wafer fabrication process comprising the steps of:

providing a primary refrigerant and a secondary refrigerant in liquid form;

spraying the primary refrigerant onto a device located in a pressure vessel to effect evaporation of the primary refrigerant;

recovering the evaporated primary refrigerant in a heat exchanger;

conveying the secondary refrigerant through the heat exchanger to precooling the secondary refrigerant by use of the evaporated primary refrigerant;

conveying the precooled secondary refrigerant to the device to further cool the secondary refrigerant; and controlling the flow of at least one of the primary and the secondary refrigerants to cool the susceptor to a desired temperature.

2. The method of cooling a susceptor of claim 1, wherein the flow of the secondary refrigerant is controlled to provide cooling in a step-wise pattern.

3. A refrigeration system comprising:

a pressure vessel;

a first heat exchanger which recovers the heat of vaporization of a first refrigerant, the first heat exchanger being positioned in the pressure vessel and including at least one nozzle and a refrigerant conveying system for conveying a second refrigerant, the at least one nozzle directing the first refrigerant at the refrigerant conveying system to cool the second refrigerant within the refrigerant conveying system; and a second heat exchanger which recovers the enthalpy available in the first refrigerant directed from the at least one nozzle of the first heat exchanger, the second heat exchanger being positioned in the pressure vessel and including an inner tube for conveying the second refrigerant to the refrigerant conveying system of the first heat exchanger, and an outer tube surrounding the inner tube which receives first refrigerant recovered from the first heat exchanger to precool the second refrigerant before the second refrigerant is conveyed to the refrigerant conveying system.

4. The refrigeration system of claim 3, wherein the second refrigerant is nitrogen.

5. The refrigeration system of claim 3, wherein the second refrigerant is one of propane, ethanol, propylene, methane, ammonia, n-butane, iso-butane, and mixtures thereof.

6. The refrigeration system of claim 3, wherein the first heat exchanger is a spray heat exchanger.

7. The refrigeration system of claim 3, wherein the second heat exchanger is a shell and tube heat exchanger.

8. The refrigeration system of claim 3, wherein the refrigerant conveying system of the first heat exchanger includes a plurality of tubes connected to a manifold, and wherein said at least one nozzle includes two nozzles that direct the first refrigerant at the plurality of tubes from opposite sides of the plurality of tubes.

9. The refrigeration system of claim 3, further comprising a modulating valve and a solenoid valve for controlling the flow of the second refrigerant to an object to be cooled.

10. The refrigeration system of claim 9, further comprising a by-pass valve for recirculating the second refrigerant through the first and second heat exchangers.

11. The refrigeration system of claim 10, further comprising a control system for controlling the modulating, solenoid, and by-pass valves according to a preset temperature program.

12. The refrigeration system of claim 3, wherein the pressure vessel is a vacuum jacketed pressure vessel.

13. A refrigeration system comprising:

a pressure vessel;

a primary liquid refrigerant delivery system which includes at least one spray nozzle mounted within the pressure vessel;

a secondary refrigerant circulation system which circulates a secondary refrigerant through the pressure vessel to an object to be cooled, the at least one spray nozzle being positioned to spray the primary liquid refrigerant at a portion of the secondary refrigerant circulation system, the sprayed primary liquid refrigerant evaporating and cooling the secondary refrigerant;

a gas recovery system within the pressure vessel to recover the evaporated primary refrigerant and precool the secondary refrigerant.

14. The refrigeration system of claim 13, wherein the secondary refrigerant circulation system includes at least one delivery valve for providing energy removal to the object to be cooled and a by-pass valve for providing greater energy removal in a shorter duration of time than the delivery valve.

15. The refrigeration system of claim 14, wherein the at least one delivery valve includes a modulating valve and a solenoid valve for controlling the flow of the secondary refrigerant to the object to be cooled.

16. The refrigeration system of claim 13, wherein the secondary refrigerant circulation system includes a plate heat exchanger having a plurality of tubes connected to a manifold.

17. The refrigeration system of claim 13, wherein the gas recovery system includes a counter current heat exchanger.

18. The refrigeration system of claim 17, wherein the counter current heat exchanger is a shell and tube heat exchanger.

19. The refrigeration system as claimed in claim 13, wherein the primary refrigerant is nitrogen.

20. The refrigeration system as claimed in claim 13, wherein the secondary refrigerant is one of propane, ethanol, propylene, methane, ammonia, n-butane, iso-butane, and mixtures thereof.

21. The refrigeration system of claim 13, wherein the pressure vessel is a vacuum jacketed pressure vessel.

22. A method of cooling an object comprising the steps of:

providing a primary refrigerant and a secondary refrigerant in liquid form;

spraying the primary refrigerant onto a device located in a pressure vessel to effect evaporation of the primary refrigerant;

recovering the evaporated primary refrigerant in a heat exchanger;

conveying the secondary refrigerant through the heat exchanger to precooling the secondary refrigerant by use of the evaporated primary refrigerant;

conveying the precooled secondary refrigerant to the device to further cool the secondary refrigerant; and circulating the cooled secondary refrigerant to cool the object.

23. The method of cooling of claim 22, wherein the secondary refrigerant is precooled in a counter current heat exchanger comprising concentric tubes.

24. The method of cooling of claim 22, wherein the object to be cooled is a susceptor in a semiconductor wafer fabrication process.

25. The method of cooling of claim 24, wherein the primary refrigerant is nitrogen.

26. The method of cooling of claim 22, wherein the primary refrigerant is nitrogen.

27. The method of cooling of claim 22, wherein said step of conveying the secondary refrigerant through a heat exchanger includes conveying the secondary refrigerant through a heat exchanger located in the pressure vessel.

* * * * *